US012685046B2

(12) United States Patent
Nam et al.

(10) Patent No.: US 12,685,046 B2
(45) Date of Patent: Jul. 14, 2026

(54) DOPED SILICON OXIDE FOR BOTTOM-UP DEPOSITION

(71) Applicant: Applied Materials, Inc., Santa Clara, CA (US)

(72) Inventors: Woongsik Nam, Santa Clara, CA (US); Euhngi Lee, San Jose, CA (US); Tianyang Li, San Jose, CA (US); Jisung Park, Sunnyvale, CA (US); Hang Yu, San Jose, CA (US); Deenesh Padhi, Saratoga, CA (US); Shichen Fu, Santa Clara, CA (US); Yufeng Jiang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 392 days.

(21) Appl. No.: 18/210,522

(22) Filed: Jun. 15, 2023

(65) Prior Publication Data

US 2024/0420949 A1     Dec. 19, 2024

(51) Int. Cl.
*H01L 21/02* (2006.01)
*H10P 14/60* (2026.01)
*H10P 14/692* (2026.01)

(52) U.S. Cl.
CPC .... *H10P 14/69215* (2026.01); *H10P 14/6336* (2026.01)

(58) Field of Classification Search
None
See application file for complete search history.

(56) References Cited

U.S. PATENT DOCUMENTS

2009/0286381 A1    11/2009   Van Schravendijk et al.
2018/0330980 A1    11/2018   Liang et al.
(Continued)

FOREIGN PATENT DOCUMENTS

KR      20180124788  A     11/2018
TW         I721270  B      3/2021
(Continued)

OTHER PUBLICATIONS

TW113115046, "Office Action", Feb. 11, 2025, 6 pages.
(Continued)

*Primary Examiner* — Asok K Sarkar
(74) *Attorney, Agent, or Firm* — Kilpatrick Townsend & Stockton LLP

(57) ABSTRACT

Exemplary processing methods may include i) providing one or more deposition precursors to a processing region of a semiconductor processing chamber. A substrate may be housed within the processing region. The substrate may include one or more features defining one or more sidewalls. The methods may include ii) forming plasma effluents of the one or more deposition precursors. The methods may include iii) contacting the substrate with the plasma effluents of the one or more deposition precursors. The contacting may deposit a doped silicon-and-oxygen-containing material on the substrate. A first portion of the doped silicon-and-oxygen-containing material deposited on the one or more sidewalls of the one or more features may be characterized by a poorer film quality than a second portion of the doped silicon-and-oxygen-containing material deposited on a lower portion of the one or more features.

20 Claims, 3 Drawing Sheets

(56) References Cited

U.S. PATENT DOCUMENTS

| | | | |
|---|---|---|---|
| 2020/0321209 A1* | 10/2020 | Ishikawa | ............. H01L 21/0234 |
| 2021/0320034 A1 | 10/2021 | Lei et al. | |
| 2022/0020599 A1* | 1/2022 | Koshizawa | ....... H01L 21/02274 |

FOREIGN PATENT DOCUMENTS

| | | |
|---|---|---|
| TW | 202217985 A | 5/2022 |
| WO | 2023/102397 A1 | 6/2023 |

OTHER PUBLICATIONS

International Search Report and Written Opinion for PCT/US2024/025400 mailed Aug. 26, 2024, 10 pages.
Taiwanese Application No. 113115046, Notice of Decision to Grant mailed on Sep. 9, 2025, 4 pages (2 pages of English Translation and 2 pages of original documents).

* cited by examiner

200

300

310

305

315

305

DOPED SILICON OXIDE FOR BOTTOM-UP DEPOSITION

TECHNICAL FIELD

The present technology relates to semiconductor processing. More specifically, the present technology relates depositing materials for gap fill processes.

BACKGROUND

Integrated circuits are made possible by processes which produce intricately patterned material layers on substrate surfaces. Producing patterned material on a substrate requires controlled methods of formation and removal of exposed material. As device sizes continue to shrink, material formation may affect subsequent operations. For example, in gap filling operations a material may be formed or deposited to fill a trench or other features formed on a semiconductor substrate. As features may be characterized by higher aspect ratios and reduced critical dimensions, these filling operations may be challenged. For example, as the deposition may occur at the top and along sidewalls of the feature, continued deposition may pinch off the feature and may produce voids within the feature. This can impact device performance and subsequent processing operations. In some devices, it may be necessary to selectively remove sidewall material deposited in the features.

Thus, there is a need for improved systems and methods that can be used to produce high quality devices and structures. These and other needs are addressed by the present technology.

SUMMARY

Exemplary processing methods may include i) providing one or more deposition precursors to a processing region of a semiconductor processing chamber. A substrate may be housed within the processing region. The substrate may include one or more features defining one or more sidewalls. The methods may include ii) forming plasma effluents of the one or more deposition precursors. The methods may include iii) contacting the substrate with the plasma effluents of the one or more deposition precursors. The contacting may deposit a doped silicon-and-oxygen-containing material on the substrate. A first portion of the doped silicon-and-oxygen-containing material deposited on the one or more sidewalls of the one or more features may be characterized by a poorer film quality than a second portion of the doped silicon-and-oxygen-containing material deposited on a lower portion of the one or more features.

In some embodiments, the one or more features may include a trench characterized by a width of greater than or about 0.25 μm. The one or more deposition precursors may include a silicon-containing precursor, an oxygen-containing precursor, and a dopant precursor. The dopant precursor may be a boron-containing precursor, a fluorine-containing precursor, a nitrogen-containing precursor, or a phosphorous-containing precursor. The plasma effluents may be formed at a plasma frequency of less than or about 1,500 kHz. The doped silicon-and-oxygen-containing material may be characterized by a dopant concentration of less than or about 30 at. %. A thickness of the doped silicon-and-oxygen-containing material may be greater than or about 75 Å. The methods may include iv) selectively removing the first portion of the doped silicon-and-oxygen-containing material from the one or more sidewalls of the one or more features. Selectively removing the first portion of the doped silicon-and-oxygen-containing material may include contacting the substrate with a fluorine-containing precursor. The methods may include, subsequent to iv) selectively removing the first portion of the doped silicon-and-oxygen-containing material, repeating operations i) through iii) to deposit additional doped silicon-and-oxygen-containing material on the substrate.

Some embodiments of the present technology may encompass semiconductor processing methods. The methods may include providing a silicon-containing precursor, an oxygen-containing precursor, and a dopant precursor to a processing region of a semiconductor processing chamber. A substrate may be housed within the processing region. The substrate may include one or more features defining one or more sidewalls. The methods may include forming plasma effluents of the silicon-containing precursor, the oxygen-containing precursor, and the dopant precursor. The methods may include contacting the substrate with the plasma effluents of the silicon-containing precursor, the oxygen-containing precursor, and the dopant precursor. The contacting may deposit a doped silicon-and-oxygen-containing material on the substrate. The methods may include selectively removing a portion of the doped silicon-and-oxygen-containing material from the one or more sidewalls of the one or more features.

In some embodiments, the dopant precursor may be a boron-containing precursor, a fluorine-containing precursor, a nitrogen-containing precursor, or a phosphorous-containing precursor. The plasma effluents may be formed at a plasma power of less than or about 1,500 W. A thickness of the doped silicon-and-oxygen-containing material may be less than or about 10 μm. The methods may include repeating the operations of contacting the substrate with the plasma effluents of the silicon-containing precursor, the oxygen-containing precursor, and the dopant precursor to deposit the doped silicon-and-oxygen-containing material on the substrate and selectively removing the portion of the doped silicon-and-oxygen-containing material from the one or more sidewalls of the one or more features to perform a bottom-up deposition. A temperature in the processing region may be maintained at greater than or about 100° C. A pressure in the processing region may be maintained at less than or about 50 Torr.

Some embodiments of the present technology may encompass semiconductor processing methods. The methods may include providing a silicon-containing precursor, an oxygen-containing precursor, and a dopant precursor to a processing region of a semiconductor processing chamber. A substrate may be housed within the processing region. The substrate may include one or more features defining one or more sidewalls. The methods may include forming plasma effluents of the silicon-containing precursor, the oxygen-containing precursor, and the dopant precursor. The plasma effluents may be formed at a plasma frequency of less than or about 1,500 kHz. The methods may include contacting the substrate with the plasma effluents of the silicon-containing precursor, the oxygen-containing precursor, and the dopant precursor. The contacting may deposit a doped silicon-and-oxygen-containing material on the substrate.

In some embodiments, the methods may include selectively removing a portion of the doped silicon-and-oxygen-containing material from the one or more sidewalls of the one or more features. The doped silicon-and-oxygen-containing material may be characterized by a dopant concentration of less than or about 25 at. %.

Such technology may provide numerous benefits over conventional systems and techniques. For example, by performing sequential deposition and etch operations according to embodiments of the present technology, sidewall coverage can be limited or controlled, which may allow for bottom-up deposition. Additionally, by providing one or more dopant precursors to produce a doped material, the material formed on sidewalls may be selectively removed relative to other material on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
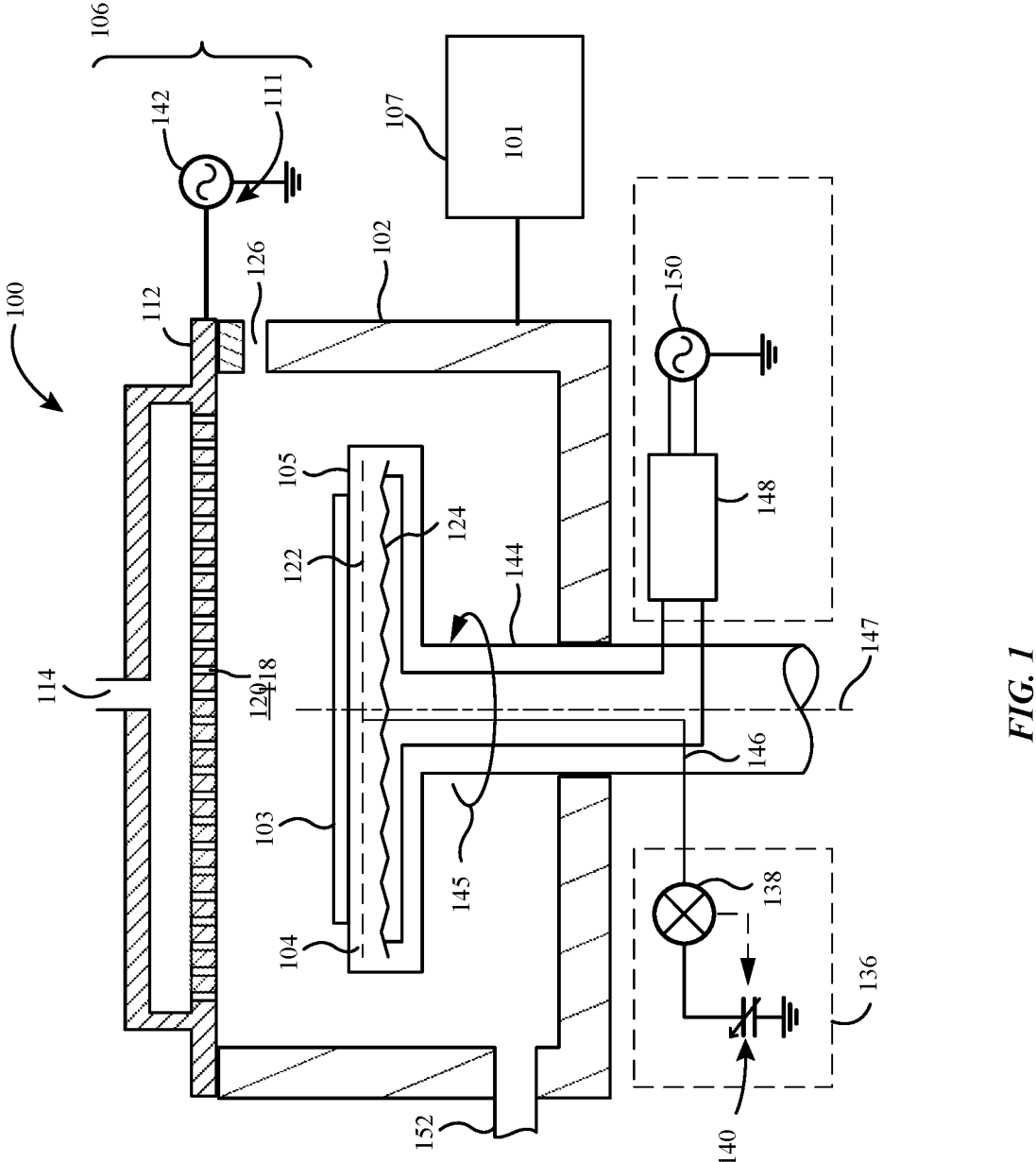
FIG. 1 shows a schematic cross-sectional view of an exemplary processing chamber according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Silicon-and-oxygen-containing material may be used in semiconductor device manufacturing for a number of structures and processes. Some examples include using silicon-and-oxygen-containing material as a sacrificial material. For example, the silicon-and-oxygen-containing material may be used as, but is not limited to, a dummy gate material, as a gap fill material, or on a 3D NAND staircase. In gap filling operations, some processing may utilize plasma-enhanced deposition under process conditions to increase the directionality of the deposition, which may allow the deposited material to better fill features on the substrate.

As feature sizes continue to shrink, plasma-enhanced depositions may be challenged for narrow features, which may be further characterized by higher aspect ratios. For example, pinching-off in the feature may more readily occur due to deposition on sidewalls of the feature, which in small feature sizes may further restrict flow and deposition into the feature, and may produce seams or voids in the feature. Conventional technologies have attempted to address the formation of seams or voids by utilizing additional operations to achieve bottom-up deposition, such as inhibition operations, various treatment operations, and/or intermittent etch back operations. However, these operations need to be performed frequently to maintain bottom-up deposition and reduce throughput. Additionally, these operations introduce additional chemistries necessary to perform the operations. Furthermore, only a relatively thin layer of material may be deposited to allow for performing these additional operations to achieve bottom-up deposition.

The present technology may overcome these limitations by depositing material through a cycle of deposition with one or more dopants and etching. Due to the processing conditions and/or precursors, the deposition may deposit a conformal material with poor sidewall quality. Doped silicon-and-oxygen-containing material deposited on the sidewalls of the features being filled bottom-up may more readily be removed relative to material deposited at a bottom of the features. An etching operation may selectively remove the sidewall material and allow for a subsequent looping of deposition and etch to fill the features from the bottom-up. By repeating these cycles, a feature may be filled with doped silicon-and-oxygen-containing material without the formation of a void or seam.

After describing general aspects of a chamber according to some embodiments of the present technology in which plasma processing operations discussed below may be performed, specific methodology may be discussed. It is to be understood that the present technology is not intended to be limited to the specific films, chambers or processes discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers, etch material layers, form other material layers, or a combination thereof, although it is to be understood that deposition and etch methods may similarly be performed in any chamber within which deposition and etch processes may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. In some embodiments, the substrate support 104 may be rotatable, as indicated by the arrow 145, along an axis 147, where a shaft 144 of the substrate support 104 may be locate, or may be stationary. Alternatively, the substrate support 104 may be lifted up to rotate as necessary during a deposition process.

A gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

A first electrode 122 may be coupled with the substrate support 104. The first electrode 122 may be embedded within the substrate support 104 or coupled with a surface of the substrate support 104. The first electrode 122 may be a plate, a perforated plate, a mesh, a wire screen, or any other distributed arrangement of conductive elements. The first electrode 122 may be a tuning electrode and may be coupled with a tuning circuit 136 by a conduit 146, for example a cable having a selected resistance, such as 50 ohms, for example, disposed in the shaft 144 of the substrate support 104. The tuning circuit 136 may have an electronic sensor 138 and an electronic controller 140, which may be a variable capacitor. The electronic sensor 138 may be a voltage or current sensor and may be coupled with the second electronic controller 140 to provide further control over plasma conditions in the processing volume 120.

A second electrode 124, which may be a bias electrode and/or an electrostatic chucking electrode, may be coupled with the substrate support 104. The second electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120, such as via a system controller 101 which may be contained within a processor 107. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the second electrode 124 in some embodiments.

Upon energizing a plasma in the processing volume 120, a potential difference may be established between the plasma and the first electrode 122. The electronic controller 140 may then be used to adjust the flow properties of the ground paths represented by the tuning circuit 136. A set point may be delivered to the first circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Tuning circuit 136 may have a variable impedance that may be adjusted using the electronic controller 140. Where the electronic controller 140 is a variable capacitor, the capacitance range of each of the variable capacitors, may be chosen to provide an impedance range. This range may depend on the frequency and voltage characteristics of the plasma, which may have a minimum in the capacitance range of each variable capacitor. Hence, when the capacitance of the electronic controller 140 is at a minimum or maximum, impedance of the tuning circuit 136 may be high, resulting in a plasma shape that has a minimum aerial or lateral coverage over the substrate support. When the capacitance of the electronic controller 140 approaches a value that minimizes the impedance of the tuning circuit 136, the aerial coverage of the plasma may grow to a maximum, effectively covering the entire working area of the substrate support 104. As the capacitance of the electronic controller 140 deviates from the minimum impedance setting, the plasma shape may shrink from the chamber walls and aerial coverage of the substrate support may decline.

The electronic sensor 138 may be used to tune the circuit 136 in a closed loop. A set point for current or voltage, depending on the type of sensor used, may be installed in each sensor, and the sensor may be provided with control software that determines an adjustment to the respective electronic controller 140 to minimize deviation from the set point. Consequently, a plasma shape may be selected and dynamically controlled during processing. It is to be understood that, while the foregoing discussion is based on electronic controller 140, which may be a variable capacitor, any electronic component with adjustable characteristic may be used to provide tuning circuit 136 with adjustable impedance.

Figure 2:
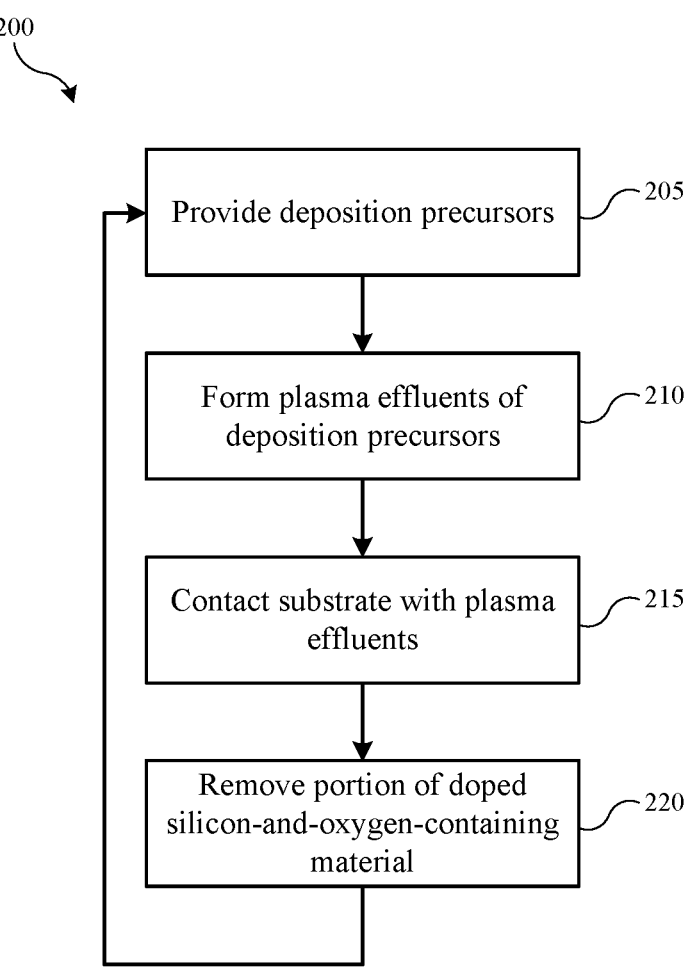
FIG. 2 shows exemplary operations in a processing method according to some embodiments of the present technology.
Figure 3A:
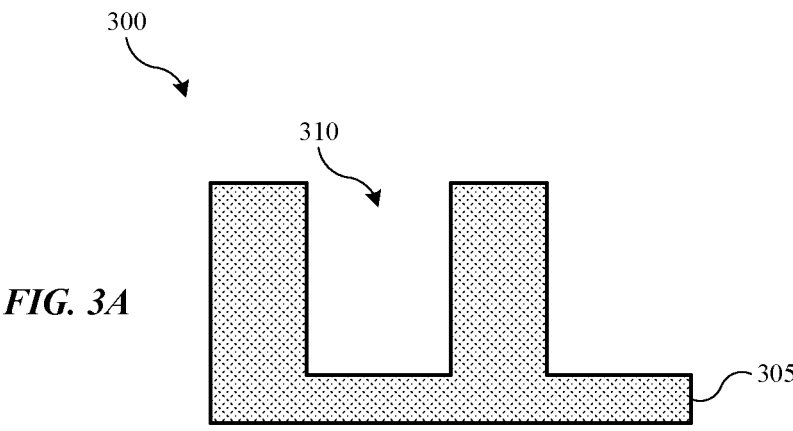
FIGS. 3A-3C show schematic cross-sectional views of a substrate during a processing according to some embodiments of the present technology.

Processing chamber 100 may be utilized in some embodiments of the present technology for processing methods that may include bottom-up deposition of materials for semiconductor structures. It is to be understood that the chamber described is not to be considered limiting, and any chamber that may be configured to perform operations as described may be similarly used. FIG. 2 shows exemplary operations in a processing method 200 according to some embodiments of the present technology. The method may be performed in a variety of processing chambers and on one or more mainframes or tools, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIGS. 3A-3C, the illustrations of which will be described in conjunction with the operations of method 200. It is to be understood that the figures illustrate only partial schematic views, and a substrate may contain any number of additional materials and features having a variety of characteristics and aspects as illustrated in the figures.

Method 200 may include additional operations prior to initiation of the listed operations. For example, additional processing operations may include forming structures or features on a substrate, which may include both forming and removing material. For example, transistor structures, memory structures, or any other structures may be formed. Prior processing operations may be performed in the chamber in which method 200 may be performed, or processing may be performed in one or more other processing chambers prior to delivering the substrate into the semiconductor processing chamber or chambers in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above.

A substrate on which several operations have been performed may be substrate 305 of a structure 300, which may show a partial view of a substrate on which semiconductor processing may be performed. It is to be understood that structure 300 may show only a few top layers during processing to illustrate aspects of the present technology. The substrate 305 may include a material in which one or more features 310 may be formed. Substrate 305 may be any number of materials used in semiconductor processing. The substrate material may be or include silicon, germanium, dielectric materials including silicon oxide or silicon nitride, metal materials, or any number of combinations of these materials, which may be the substrate 305, or materials formed in structure 300. Features 310 may be characterized by any shape or configuration according to the present technology. In some embodiments, the features may be or include a trench structure or aperture formed within the substrate 305. In other embodiments, the features may include a staircase-like structure, such as in 3D NAND applications.

Although the features 310 may be characterized by any shapes or sizes, in some embodiments the features 310 may be characterized by higher aspect ratios, or a ratio of a depth of the feature to a width across the feature. For example, in some embodiments features 310 may be characterized by aspect ratios greater than or about 1:1, and may be characterized by aspect ratios greater than or about 2:1, greater than or about 3:1, greater than or about 5:1, greater than or about 10:1, or greater. The features may be characterized by various widths or diameters across the feature including between two sidewalls, such as a dimension greater than or about 0.1 μm, and may be characterized by a width across the feature of greater than or about 0.2 μm, greater than or about 0.3 μm, greater than or about 0.4 μm, greater than or about 0.5 μm, greater than or about 0.6 μm, greater than or about 0.7 μm, greater than or about 0.8 μm, greater than or about 0.9 μm, greater than or about 1.0 μm, greater than or about 1.1 μm, greater than or about 1.2 μm, greater than or about 1.3 μm, greater than or about 1.4 μm, greater than or about 1.5 μm, greater than or about 2.0 μm, or more.

In some embodiments, method 200 may include optional treatment operations, such as a pretreatment, that may be performed to prepare a surface of substrate 305 for deposition. Once prepared, method 200 may include providing one or more deposition precursors to a processing region of the semiconductor processing chamber housing the structure 300 at operation 205. The one or more deposition precursors may include a silicon-containing precursor, an oxygen-containing precursor, and/or a dopant precursor, as well as one or more diluents or carrier gases such as an inert gas or other gas delivered with the one or more deposition precursors. Silicon-containing precursors that may be used during the deposition of a doped silicon-and-oxygen-containing material may include, but are not limited to, silane ($SiH_4$), disilane ($Si_2H_6$), trisilane ($Si_3H_8$), tetrasilane ($Si_4H_{10}$), pentasilane ($Si_5H_{12}$), or other organosilanes including cyclo-hexasilanes, silicon tetrafluoride ($SiF_4$), silicon tetrachloride ($SiCl_4$), dichlorosilane ($SiH_2Cl_2$), tetraethyl orthosilicate (TEOS), as well as any other silicon-containing precursors that may be used in silicon-and-oxygen-containing film formation. Oxygen-containing precursors that may be used during the deposition of the doped silicon-and-oxygen-containing material may include, but are not limited to, diatomic oxygen ($O_2$), nitrous oxide ($N_2O$), nitrogen dioxide ($NO_2$), ozone ($O_3$), steam ($H_2O$), as well as any other oxygen-containing precursors that may be used in silicon-and-oxygen-containing film formation. The dopant precursor may be a boron-containing precursor, a fluorine-containing precursor, a nitrogen-containing precursor, or a phosphorous-containing precursor. Dopant precursors that may be used during the deposition of the doped silicon-and-oxygen-containing material may include, but are not limited to, borane ($BH_3$), diborane ($B_2H_6$), boron trichloride ($BCl_3$), diatomic fluorine ($F_2$), nitrogen trifluoride ($NF_3$), carbon tetrafluoride ($CF_4$), hydrogen fluoride (HF), xenon difluoride ($XeF_2$), diatomic nitrogen ($N_2$), nitrous oxide ($N_2O$), nitrogen dioxide ($NO_2$), ammonia ($NH_3$), diazene ($N_2H_2$), phosphine ($PH_3$), phosphorous fluoride ($PF_3$), as well as any other dopant precursors that may be used in doped silicon-and-oxygen-containing material film formation.

Figure 3B:
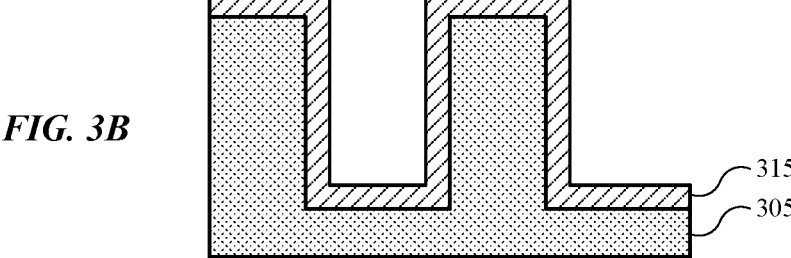

Plasma effluents may be formed of the one or more deposition precursors at operation 210. The deposition plasma effluents may be formed within the processing region, which may allow the doped silicon-and-oxygen-containing material 315 to deposit on the substrate 305 as illustrated in FIG. 3B. For example, in some embodiments a capacitively-coupled plasma may be formed within the processing region by applying plasma power to the faceplate or substrate support as previously described.

The power applied during deposition may be a lower frequency plasma, which may maintain a lower ion density and an increased ion energy. The increased ion energy may result in more directional or anisotropic bombardment during the deposition of the doped silicon-and-oxygen-containing material 315. In embodiments, the plasma effluents may be formed at a plasma frequency of less than or about 1,500 kHz, and may be formed at a plasma frequency of less than or about 1,250 kHz, less than or about 1,000 kHz, less than or about 900 kHz, less than or about 800 kHz, less than or about 700 kHz, less than or about 600 kHz, less than or about 500 kHz, less than or about 400 kHz, less than or about 300 kHz, less than or about 250 kHz, less than or about 200 kHz, less than or about 150 kHz, less than or about 100 kHz, or less. At plasma frequencies greater than, for example, 1,500 kHz, the plasma effluents may be characterized increased ion density and may have less directionality. The reduced directionality may not deposit lower quality material on sidewalls of the features 310, which may frustrate the removal of sidewall material as further discussed below.

The power applied during deposition may be a lower power plasma, which may limit dissociation, and which may maintain a deposition rate of silicon-containing material that does not clog the feature 310. Accordingly, in embodiments the plasma power delivered to the faceplate or substrate support may be less than or about 1,500 W, and may be less than or about 1,250 W, less than or about 1,000 W, less than or about 900 W, less than or about 800 W, less than or about 700 W, less than or about 600 W, less than or about 500 W, less than or about 400 W, less than or about 300 W, less than or about 200 W, less than or about 100 W, less than or about 50 W, or less. At plasma powers to the faceplate or substrate support of greater than, for example, 1,500 W, the substrate 305, such as the sidewalls defining the features 310, may be damaged or the deposition rate may increase such that the features 310 may clog and pinch off.

As previously discussed, the doped silicon-and-oxygen-containing material 315 may be deposited on the substrate at operation 215 from plasma effluents of the one or more deposition precursor. The doped silicon-and-oxygen-containing material 315 may at least partially fill the features 310 on the substrate to provide a bottom-up type of gap fill. As illustrated in FIG. 3B, doped silicon-and-oxygen-containing material 315 may be deposited on the substrate 305, and deposit at the bottom of the features 310, as well as above the features 310 on the substrate 305 and on the sidewalls of the features 310. Although the amount of doped silicon-and-oxygen-containing material 315 deposited on the sidewalls may be relatively small or thin, continued formation may cause the features 310 to be pinched off. If pinched off, the formation of a seam or void in the material may occur as the gap fill continues. Accordingly, a series of depositions and etches, as further described below, may be performed to deposit seam-free doped silicon-and-oxygen-containing material 315 in the features 310.

The doped silicon-and-oxygen-containing material 315 may be characterized by a dopant concentration of less than or about 30 at. %. In embodiments, the doped silicon-and-oxygen-containing material 315 may be characterized by a dopant concentration of less than or about 29.0 at. %, less than or about 28.0 at. %, less than or about 27.0 at. %, less than or about 26.0 at. %, less than or about 25.0 at. %, less than or about 24.0 at. %, less than or about 23.0 at. %, less than or about 22.0 at. %, less than or about 21.0 at. %, less than or about 20.0 at. %, less than or about 19.0 at. %, less than or about 18.0 at. %, less than or about 17.0 at. %, less than or about 16.0 at. %, less than or about 15.0 at. %, less than or about 14.0 at. %, less than or about 13.0 at. %, less than or about 12.0 at. %, less than or about 11.0 at. %, less than or about 10.0 at. %, less than or about 9.0 at. %, less than or about 8.0 at. %, less than or about 7.0 at. %, less than or about 6.0 at. %, less than or about 5.0 at. %, less than or about 4.0 at. %, less than or about 3.0 at. %, less than or about 2.0 at. %, less than or about 1.0 at. %, or less. By incorporating an amount of dopant in the material, sidewall quality of the doped silicon-and-oxygen-containing material 315 may be poorer than the bottom quality of the doped silicon-and-oxygen-containing material 315. At increased dopant concentrations, the material may not be classified as a doped silicon-and-oxygen-containing material, such as doped silicon oxide. At reduced dopant concentrations, the sidewall quality may not be significantly differentiated from the bottom quality. Accordingly, the doped silicon-and-oxygen-containing material 315 may be characterized by a dopant concentration of greater than or about 5.0 at. %, and may be characterized by a dopant concentration of greater than or about 6.0 at. %, greater than or about 7.0 at. %, greater than or about 8.0 at. %, greater than or about 9.0 at. %, greater than or about 10.0 at. %, greater than or about 11.0 at. %, greater than or about 12.0 at. %, greater than or about 13.0 at. %, greater than or about 14.0 at. %, greater than or about 15.0 at. %, or more. The incorporation of the dopant in the doped silicon-and-oxygen-containing material 315 may result in a different lattice structure and/or different stress in the sidewall material compared to the bottom material. For example, the sidewall material may be characterized by a tensile stress while the bottom material may be characterized by a compressive stress, which may be due to ion bombardment.

A thickness of the doped silicon-and-oxygen-containing material 315 may be greater than or about 75 Å. For example, the thickness of the doped silicon-and-oxygen-containing material 315 may be greater than or about 100 Å, greater than or about 200 Å, greater than or about 300 Å, greater than or about 400 Å, greater than or about 500 Å, greater than or about 750 Å, greater than or about 1 µm, greater than or about 2 µm, greater than or about 3 µm, greater than or about 4 µm, greater than or about 5 µm, greater than or about 6 µm, greater than or about 7 µm, greater than or about 8 µm, greater than or about 9 µm, greater than or about 10 µm, or more. In some embodiments, the thickness of the doped silicon-and-oxygen-containing material 315 may be less than or about 10 µm, less than or about 8 µm, less than or about 6 µm, less than or about 4 µm, less than or about 2 µm, less than or about 1 µm, less than or about 750 Å, less than or about 500 Å, less than or about 250 Å, or less.

As previously discussed, the processing characteristics and/or deposition precursors may result in a first portion of the doped silicon-and-oxygen-containing material 315 deposited on the one or more sidewalls of the one or more features 310 being characterized by a poorer film quality than a second portion of the doped silicon-and-oxygen-containing material 315 deposited on a lower portion of the one or more features 310. For example, the first portion of the doped silicon-and-oxygen-containing material 315 deposited on the one or more sidewalls of the one or more features 310 may be characterized by a reduced density and or reduced etch resistance compared to the second portion of the doped silicon-and-oxygen-containing material 315 deposited on a lower portion of the one or more features 310. During a subsequent etching operation, as further discussed below, the first portion of the doped silicon-and-oxygen-containing material 315 may be removed selectively over the second portion of the doped silicon-and-oxygen-containing material 315 deposited on a lower portion of the one or more features 310.

Figure 3C:
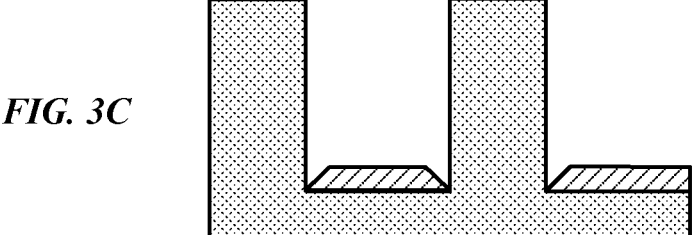

As illustrated in FIG. 3C, after a desired amount of deposition of the doped silicon-and-oxygen-containing material 315, method 200 may include removing a portion of the doped silicon-and-oxygen-containing material 315. This operation may be performed in the same chamber as the deposition. In some embodiments, flows of the one or more deposition precursors may be halted and the processing region may be purged. Subsequent a purge, a wet etch operation or a dry etch operation may be performed to selectively remove a portion of the doped silicon-and-oxygen-containing material 315. Specifically, the first portion of the doped silicon-and-oxygen-containing material 315 deposited on one or more sidewalls of the one or more features 310 may be selectively removed.

In embodiments, operation 220 may include a wet etch operation or a dry etch operation. The wet etch operation may include exposing the substrate 305 to a wet etchant, such as dilute hydrofluoric acid (dHF) or any useful buffer oxide etch (BOE) solution. The dry etch operation may include forming plasma effluents of a dry etchant precursor and contacting the substrate 305 with the dry etchant precursor or plasma effluents thereof. In embodiments, the wet etchant or the dry etchant or plasma effluents thereof may fully remove doped silicon-and-oxygen-containing material 315 from the sidewalls of the features 310 above a base fill of the doped silicon-and-oxygen-containing material 315. The base fill of the doped silicon-and-oxygen-containing material 315 may refer to the doped silicon-and-oxygen-containing material 315 deposited at the bottom of the features 310. Depending on the extent of densification, some doped silicon-and-oxygen-containing material 315 may also be removed from the bottom of the features 310 or the tops of the features 310.

In order to fill a feature on a substrate or to deposit material only on exposed regions normal to the flow of the one or more deposition precursors of plasma effluents thereof, the operations 205-220 of method 200 may be repeated to fill the feature from bottom-up. Depending on the size of the feature or the thickness of material desired, operations 205-220 may be repeated greater than about two times, greater than or about three times, greater than or about five times, greater than or about seven times, greater than or about nine times, greater than or about fifteen times, greater than or about twenty times, or more.

Temperature and pressure may also impact operations of the present technology. For example, the process may be performed at a temperature below or about 900° C., and may be performed at a temperature less than or about less than or about 800° C., less than or about 700° C., less than or about 600° C., less than or about 500° C., less than or about 400° C., less than or about 300° C., less than or about 200° C., less than or about 100° C., or less. Additionally, the process may be performed at a temperature greater than or about 100° C., and may be performed at a temperature greater than or about less than or about 200° C., greater than or about 300° C., greater than or about 400° C., greater than or about 500° C., greater than or about 600° C., greater than or about 700° C., greater than or about 800° C., or more. The temperature may be maintained in any of these ranges throughout the method, including during the treatment and etching. At higher temperatures, higher quality material may be deposited, such as material with higher density and/or increased etch resistance.

Pressure within the semiconductor processing chamber may be maintained at less than or about 50 Torr, and pressure may be maintained at less than or about 40 Torr, less than or about 30 Torr, less than or about 20 Torr, less than or about 10 Torr, less than or about 8 Torr, less than or about 6 Torr, less than or about 4 Torr, less than or about 2 Torr, less than or about 1 Torr, less than or about 0.9 Torr, less than or about 0.8 Torr, less than or about 0.7 Torr, less than or about 0.6 Torr, less than or about 0.5 Torr, or less. However, lower pressures may result in a slower fill rate of the features during the deposition, which may control fill of the features 310. Additionally, higher pressures may result in reduced pattern loading and/or line bending.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such precursors, and reference to "the doped silicon-and-oxygen-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   i) providing one or more deposition precursors to a processing region of a semiconductor processing chamber, wherein a substrate is housed within the processing region, and wherein the substrate comprises one or more features defining one or more sidewalls;
   ii) forming plasma effluents of the one or more deposition precursors; and
   iii) contacting the substrate with the plasma effluents of the one or more deposition precursors, wherein the contacting deposits a doped silicon-and-oxygen-containing material on the substrate, and wherein a first portion of the doped silicon-and-oxygen-containing material deposited on the one or more sidewalls of the one or more features is characterized by a poorer film quality than a second portion of the doped silicon-and-oxygen-containing material deposited on a lower portion of the one or more features.

2. The semiconductor processing method of claim 1, wherein the one or more features comprise a trench characterized by a width of greater than or about 0.25 μm.

3. The semiconductor processing method of claim 1, wherein the one or more deposition precursors comprise a silicon-containing precursor, an oxygen-containing precursor, and a dopant precursor.

4. The semiconductor processing method of claim 3, wherein the dopant precursor comprises a boron-containing precursor, a fluorine-containing precursor, a nitrogen-containing precursor, or a phosphorous-containing precursor.

5. The semiconductor processing method of claim 1, wherein the plasma effluents are formed at a plasma frequency of less than or about 1,500 KHz.

6. The semiconductor processing method of claim 1, wherein the doped silicon-and-oxygen-containing material is characterized by a dopant concentration of less than or about 30 at. %.

7. The semiconductor processing method of claim 1, wherein a thickness of the doped silicon-and-oxygen-containing material is greater than or about 75 Å.

8. The semiconductor processing method of claim 1, further comprising:

iv) selectively removing the first portion of the doped silicon-and-oxygen-containing material from the one or more sidewalls of the one or more features.

9. The semiconductor processing method of claim 8, wherein selectively removing the first portion of the doped silicon-and-oxygen-containing material comprises contacting the substrate with a fluorine-containing precursor.

10. The semiconductor processing method of claim 8, further comprising:

subsequent to iv) selectively removing the first portion of the doped silicon-and-oxygen-containing material, repeating operations i) through iii) to deposit additional doped silicon-and-oxygen-containing material on the substrate.

11. A semiconductor processing method comprising:

providing a silicon-containing precursor, an oxygen-containing precursor, and a dopant precursor to a processing region of a semiconductor processing chamber, wherein a substrate is housed within the processing region, and wherein the substrate comprises one or more features defining one or more sidewalls;

forming plasma effluents of the silicon-containing precursor, the oxygen-containing precursor, and the dopant precursor;

contacting the substrate with the plasma effluents of the silicon-containing precursor, the oxygen-containing precursor, and the dopant precursor, wherein the contacting deposits a doped silicon-and-oxygen-containing material on the substrate; and selectively removing a portion of the doped silicon-and-oxygen-containing material from the one or more sidewalls of the one or more features.

12. The semiconductor processing method of claim 11, wherein the dopant precursor comprises a boron-containing precursor, a fluorine-containing precursor, a nitrogen-containing precursor, or a phosphorous-containing precursor.

13. The semiconductor processing method of claim 11, wherein the plasma effluents are formed at a plasma power of less than or about 1,500 W.

14. The semiconductor processing method of claim 11, wherein a thickness of the doped silicon-and-oxygen-containing material is less than or about 10 μm.

15. The semiconductor processing method of claim 11, further comprising:

repeating the operations of contacting the substrate with the plasma effluents of the silicon-containing precursor, the oxygen-containing precursor, and the dopant precursor to deposit the doped silicon-and-oxygen-containing material on the substrate and selectively removing the portion of the doped silicon-and-oxygen-containing material from the one or more sidewalls of the one or more features to perform a bottom-up deposition.

16. The semiconductor processing method of claim 11, wherein a temperature in the processing region is maintained at greater than or about 100° C.

17. The semiconductor processing method of claim 11, wherein a pressure in the processing region is maintained at less than or about 50 Torr.

18. A semiconductor processing method comprising:

providing a silicon-containing precursor, an oxygen-containing precursor, and a dopant precursor to a processing region of a semiconductor processing chamber, wherein a substrate is housed within the processing region, and wherein the substrate comprises one or more features defining one or more sidewalls;

forming plasma effluents of the silicon-containing precursor, the oxygen-containing precursor, and the dopant precursor, wherein the plasma effluents are formed at a plasma frequency of less than or about 1,500 kHz; and contacting the substrate with the plasma effluents of the silicon-containing precursor, the oxygen-containing precursor, and the dopant precursor, wherein the contacting deposits a doped silicon-and-oxygen-containing material on the substrate.

19. The semiconductor processing method of claim 18, further comprising:

selectively removing a portion of the doped silicon-and-oxygen-containing material from the one or more sidewalls of the one or more features.

20. The semiconductor processing method of claim 18, wherein the doped silicon-and-oxygen-containing material is characterized by a dopant concentration of less than or about 25 at. %.

* * * * *